United States Patent
Okumura et al.

(10) Patent No.: US 9,523,740 B2
(45) Date of Patent: Dec. 20, 2016

(54) METHOD FOR DETERMINING REMAINING LIFETIME

(75) Inventors: Motoyoshi Okumura, Chiryu (JP); Koichi Ichikawa, Kasugai (JP); Yasushi Matsukawa, Toyohashi (JP); Katsunori Maegawa, Toyohashi (JP); Toshihiro Yamada, Toyohashi (JP)

(73) Assignees: Toyota Jidosha Kabushiki Kaisha, Toyota-shi, Aichi (JP); Primearth EV Energy Co., Ltd., Kosai-shi, Shizuoka (JP)

( * ) Notice: Subject to any disclaimer, the term of this patent is extended or adjusted under 35 U.S.C. 154(b) by 592 days.

(21) Appl. No.: 14/008,849

(22) PCT Filed: Mar. 30, 2012

(86) PCT No.: PCT/JP2012/002247
§ 371 (c)(1),
(2), (4) Date: Sep. 30, 2013

(87) PCT Pub. No.: WO2012/137456
PCT Pub. Date: Oct. 11, 2012

(65) Prior Publication Data
US 2014/0336964 A1    Nov. 13, 2014

(30) Foreign Application Priority Data
Apr. 1, 2011   (JP) .................. 2011-082078

(51) Int. Cl.
*G01R 31/36*   (2006.01)
(52) U.S. Cl.
CPC ....... *G01R 31/3606* (2013.01); *G01R 31/3679* (2013.01); *G01R 31/3658* (2013.01)

(58) Field of Classification Search
CPC ........................................... G01R 31/36
USPC .............................................. 702/63
See application file for complete search history.

(56) References Cited

U.S. PATENT DOCUMENTS

| | | | | |
|---|---|---|---|---|
| 5,606,242 A * | 2/1997 | Hull | ........... | H02J 7/0004 320/106 |
| 2012/0105010 A1* | 5/2012 | Kinoshita | ........... | H01M 4/5825 320/136 |

FOREIGN PATENT DOCUMENTS

| JP | 07-335266 | 12/1995 |
|---|---|---|
| JP | 2000-92732 | 3/2000 |
| JP | 2001-231179 | 8/2001 |
| JP | 2002-247773 | 8/2002 |
| JP | 2003-248940 | 1/2003 |
| JP | 2003-151645 | 5/2003 |
| JP | 2004-163360 | 6/2004 |

(Continued)

*Primary Examiner* — Bryan Bui
(74) *Attorney, Agent, or Firm* — Finnegan, Henderson, Farabow, Garrett & Dunner, LLP

(57) ABSTRACT

A method includes discharging an assembled battery (10) formed of a plurality of batteries until a state of charge (SOC) of the assembled battery becomes smaller or equal to a lower limit of a predetermined normal use range used in charge and discharge control of the assembled battery, measuring the discharge capacity of each of a plurality of battery blocks in the discharge of the assembled battery, the plurality of batteries being divided into the plurality of battery blocks, calculating the capacity difference in the discharge capacity among the plurality of battery blocks, and determining the remaining life of the battery block or the assembled battery based on the calculated capacity difference.

8 Claims, 4 Drawing Sheets

(56) References Cited

FOREIGN PATENT DOCUMENTS

| | | |
|---|---|---|
| JP | 2005-188965 | 7/2005 |
| JP | 2008-126788 | 6/2008 |

* cited by examiner

METHOD FOR DETERMINING REMAINING LIFETIME

CROSS-REFERENCE TO RELATED APPLICATIONS

This application is a national phase application of International Application No. PCT/JP2012/002247, filed Mar. 30, 2012, the content of which is incorporated herein by reference.

TECHNICAL FIELD

The present invention relates to a technique of estimating the remaining life of an assembled battery having a plurality of batteries connected electrically to each other.

BACKGROUND ART

When a battery is deteriorated or fails, changes occur in the change characteristics of the voltage value (V) or the resistance value (R). In a known technique, this characteristic of the battery is utilized to estimate the deterioration degree of the battery based on the changes in the voltage value or the resistance value when the battery is actually deteriorated or fails (see, for example, Patent Documents 1 to 6).

PRIOR ART DOCUMENTS

Patent Documents

Patent Document 1: Japanese Patent Laid-Open No. 2005-108565
Patent Document 2: Japanese Patent Laid-Open No. 2003-151645
Patent Document 3: Japanese Patent Laid-Open. No. 2003-028940
Patent Document 4: Japanese Patent Laid-Open No. 2001-231179
Patent Document 5: Japanese Patent Laid-Open No. 2008-126788
Patent Document 6: Japanese Patent Laid-Open No. 2000-092732

SUMMARY OF THE INVENTION

Problems to be Solved by the Invention

Particularly in a nickel metal hydride battery (Ni-MH battery), however, significant changes do not occur in the voltage value (V) or the resistance value (R) until deterioration progresses to some extent or a failure occurs actually. Thus, the conventional determination technique described above cannot be used in estimating the remaining life of the battery.

It is thus an object of the present invention to provide a technique of estimating the remaining life of a battery in which significant changes do not occur in the voltage value (V) or the resistance value (R) even when the battery approaches the end of its life.

Means for Solving the Problems

According to a first aspect, the present invention provides a remaining life determination method including discharging an assembled battery formed of a plurality of batteries until the State Of Charge (SOC) of the assembled battery becomes smaller or equal to the lower limit of a predetermined normal use range used in charge and discharge control of the assembled battery, measuring the discharge capacity of each of a plurality of battery blocks in the discharge of the assembled battery, the plurality of batteries being divided into the plurality of battery blocks, calculating the capacity difference in the discharge capacity among the plurality of battery blocks, and determining the remaining life of the battery block or the assembled battery based on the calculated capacity difference.

Each battery block can correspond to each battery or a plurality of batteries. Specifically, when the assembled battery is divided into each battery, each battery corresponds to each battery block. Alternatively, a single battery block may be formed of a plurality of batteries, and in this case, a plurality of such battery blocks constitute the assembled battery. When the capacity difference between the maximum value and the minimum value of the discharge capacities of the plurality of battery blocks is equal to or larger than a predetermined value, it can be determined that the remaining life of the assembled battery or any battery block having a smaller discharge capacity is equal to or shorter than a predetermined period.

The lower limit of the normal use range can be set at a State of Charge (SOC) of 40%. Since the SOC of 40% is often set as the lower limit of the SOC in performing charge and discharge of the assembled battery, the discharge of the assembled battery to the lower limit or lower can produce a noticeable variation of the discharge capacities of the plurality of battery blocks to perform the remaining life determination more accurately.

The lower limit of the normal use range can also be set at a State of Charge (SOC) of 0%. This can produce a more noticeable variation of the discharge capacities of the plurality of battery blocks to achieve the remaining life determination more precisely.

The assembled battery can be discharged until the State of Charge (SOC) of the assembled battery becomes smaller or equal to the lower limit from a reference value serving as a target value in the charge and discharge control. Since the reference value (SOC) is lower than the SOC corresponding to the full charge state, the variation of the discharge capacities of the plurality of battery blocks can be recognized quickly and efficiently as compared with the discharge of the assembled battery started in the full charge state.

The assembled battery not subjected to charge or discharge processing after removal from a vehicle can be used to perform the discharge until the State of Charge (SOC) becomes smaller or equal to the lower limit. This is because discharge started in a forcedly charged state mitigates displacement of balance of capacity (capacity relationship between a positive electrode and a negative electrode) resulting from the actual use on the vehicle to hinder the observation of the discharge capacity variation.

Advantage of the Invention

According to the present invention, in the battery in which significant changes do not occur in the voltage value (V) or the resistance value (R) even when the battery approaches the end of its life, the technique of estimating the remaining life of the battery can be provided.

MODE FOR CARRYING OUT THE INVENTION

An embodiment of the present invention will hereinafter be described.

The present embodiment provides a technique of determining the remaining life of an assembled battery recovered from a vehicle or the like. The remaining life refers to the time period for which the assembled battery or a battery, later described, can continue to be used in the future within the range satisfying predetermined charge and discharge characteristics.

Figure 1:
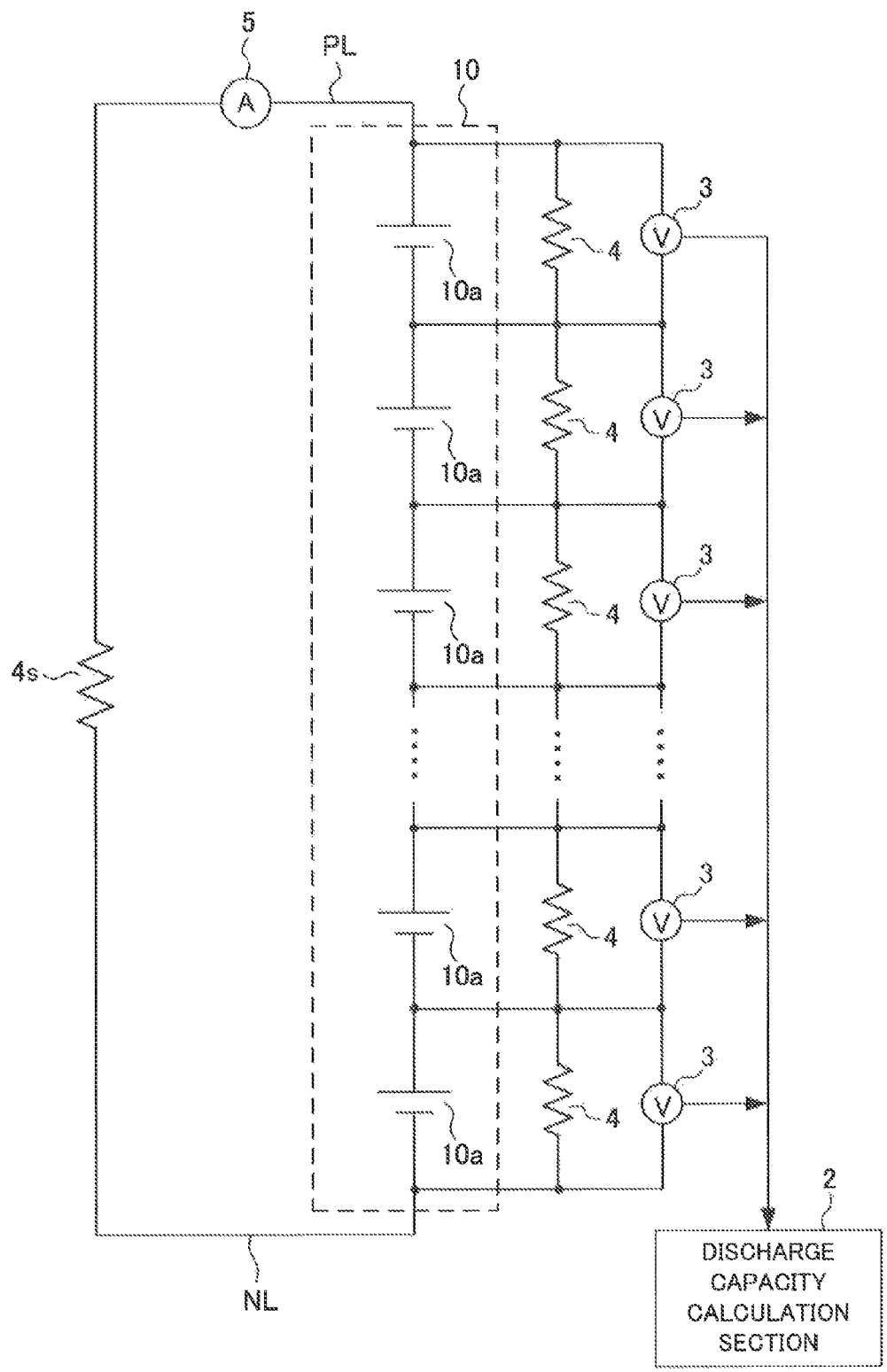
FIG. 1 is a diagram schematically showing a remaining life determination system which determines the remaining life of an assembled battery (battery).

FIG. 1 is a diagram schematically showing a remaining life determination system which determines the remaining life of the assembled battery. The present embodiment is illustrated with the example in which the assembled battery to be determined for the remaining life is a nickel metal hydride battery (Ni-MH battery) recovered from a vehicle. A secondary battery such as a lithium-ion battery can be used in addition to the nickel metal hydride battery.

The assembled battery 10 is an assembled battery (battery pack) formed of a plurality of batteries 10a connected electrically in series. While FIG. 1 shows the batteries 10a (corresponding to battery blocks) as cells, the present invention is not limited thereto.

Specifically, when a plurality of (for example, six) cells are connected electrically in series to constitute a battery module, the battery module can be used as the battery 10a, shown in FIG. 1. The battery module is provided as a single unit. Thus, the plurality of cells can be put into a single case to form the battery module. In this case, a plurality of such battery modules can be connected electrically in series to constitute the assembled battery 10. Alternatively, a plurality of such battery modules connected electrically in series may be used as the battery 10a shown in FIG. 1.

A positive terminal of the assembled battery 10 is connected to a load 4s through a positive electrode line PL, and a negative terminal of the assembled battery 10 is connected to the load 4s through a negative electrode line NL. A current sensor 5 detects the value of electric current in the assembled battery 10 when the assembled battery 10 is connected to the load 4s. An electric resistor 4 serving as a discharge circuit is connected electrically in parallel to each of the batteries 10a. A voltage sensor 3 is provided for each of the batteries 10a, detects the voltage of each of the batteries 10a when the assembled battery 10 is discharged, and outputs the detection result to a discharge capacity calculating section 2.

The State of Charge (SOC) of the assembled battery 10 refers to the rate calculated by subtracting a discharged current amount from a full charge state of the assembled battery 10. In other words, the SOC indicates the ratio of the present charge capacity to the full charge capacity. Since the full charge capacity changes as the assembled battery 10 is used (deteriorated), the SOC is calculated by using the present full charge capacity as the reference. The full charge capacity includes a full charge capacity when the assembled battery 10 is in the initial state and a full charge capacity after the assembled battery 10 is used (deteriorated). The initial state means the state immediately after the assembled battery 10 is manufactured, that is, the state when the assembled battery 10 is used for the first time. The full charge capacity after the assembled battery 10 is used is lower than the full charge capacity when the assembled battery 10 is in the initial state.

The SOC of the assembled battery 10 can be estimated from the total value of discharge currents measured by the current sensor 5 or can be estimated from the electromotive force of the assembled battery 10 calculated by using the voltage measured by the voltage sensor 3. It goes without saying that the SOC of the assembled battery 10 can be estimated with various known estimation methods.

A discharge curve (showing changes in voltage relative to the discharge capacity) of each of the batteries 10a can be obtained on the basis of the detection result of the voltage sensor 3 when each of the batteries 10a is discharged.

While the plurality of batteries 10a constituting the assembled battery 10 are connected electrically in series in the present embodiment, the assembled battery 10 may include a plurality of batteries 10a connected electrically in parallel to each other.

In the vehicle on which the assembled battery 10 described above is mounted, the output from the assembled battery 10 can be used to run the vehicle, or a kinetic energy generated in braking of the vehicle can be stored as regenerative power in the assembled battery 10. Specifically, the assembled battery 10 can be connected electrically to a motor generator, and the motor generator converts the electric energy output from the assembled battery 10 into a kinetic energy for use in running of the vehicle or converts the kinetic energy generated in braking of the vehicle into an electric energy to be supplied to the assembled battery 10.

Figure 2:
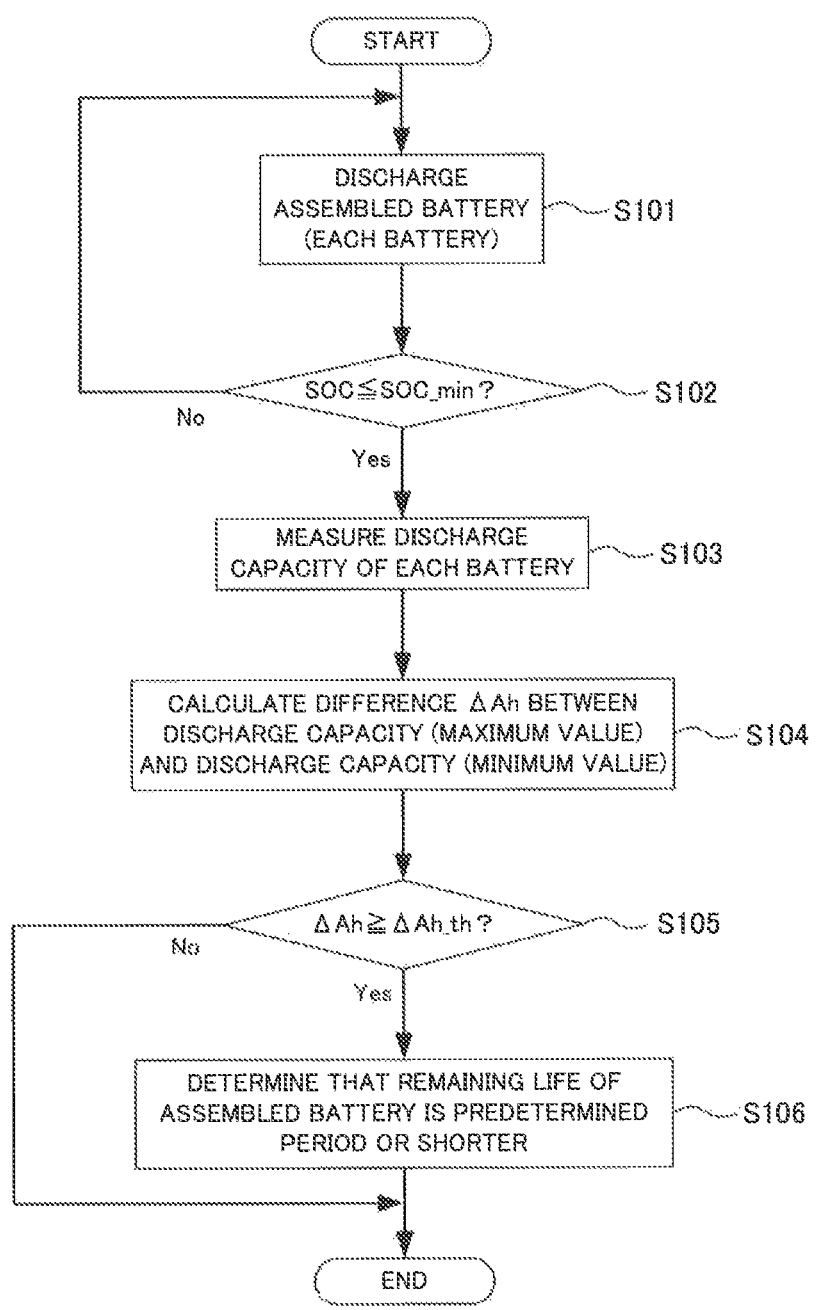
FIG. 2 is a flow chart showing the flow of processing in a battery deterioration determination method according to the present embodiment.

FIG. 2 is a flow chart showing the flow of processing in a battery deterioration determination method according to the present embodiment.

First, the assembled battery 10 having the plurality of batteries 10a connected electrically is discharged until the SOC becomes smaller or equal to a lower limit SOC_min of a normal use range (S101, S102). Specifically, the assembled battery 10 is connected to the load 4s and is discharged and thus the SOC of the assembled battery 10 becomes smaller or equal to, the lower limit SOC_min.

In the discharge of the assembled battery 10 (battery 10a), the discharge rate can be set at 1 It or lower. During the discharge of the assembled battery 10, the voltage value of each of the batteries 10a is detected by the associated voltage sensor 3. The voltage value of the battery 10a is reduced due to the discharge of the assembled battery 10.

The normal use range means the range of the SOC in which the following conditions (1) to (3) are satisfied:

(1) the input/output (W) can be sufficiently ensured in response to the requirements of the vehicle;

(2) the required remaining life is provided; and (3) the charge/discharge capacity (energy amount (Wh)) can be sufficiently ensured.

Thus, the normal use range means the use range in which, when the assembled battery 10 is mounted on the vehicle, the assembled battery 10 sufficiently achieves the input/output performance required of the assembled battery 10, and simultaneously, significant deterioration of the assembled battery 10 can be suppressed through the use within the use range. The normal use range may be determined on the basis of the input/output characteristics specific to the assembled battery 10 (battery 10a) or may be determined on the basis of requirement from the vehicle.

When the SOC of the assembled battery 10 reaches the lower limit SOC_min of the normal use range, control is typically performed to limit the discharge of the assembled battery 10 such that the SOC of the assembled battery 10 does not fall below the lower limit SOC_min. On the other hand, when the SOC of the assembled battery 10 reaches the upper limit SOC_max of the normal use range, control is typically performed to limit the charge of the assembled battery 10 such that the SOC of the assembled battery 10 does not exceed, the upper limit SOC_max.

The cutoff voltage (discharge cutoff voltage) at which the discharge processing described above is finished corresponds to the cutoff voltage of the battery 10a. For example, when the battery 10a is formed of the cell, the cutoff voltage of the cell corresponds to the cutoff voltage at which the discharge processing is finished. When the battery 10a is formed as the battery module, the voltage of approximately 6.0 V to 7.2 V detected by the voltage sensors 3 can be used as the cutoff voltage at which the discharge processing is finished.

Specifically, when the battery module is formed of six nickel metal hydride batteries (cells) the nickel metal hydride battery (cell) has a cutoff voltage of 1.0 to 1.2 V, and thus the detection of the voltage of approximately 6.0 V to 7.2 V in the battery module allows the estimation that the battery module is discharged to near the lower limit SOC_min of the normal use range. On the other hand, when the battery 10a is formed of a plurality of battery modules, the cutoff voltage at which the discharge processing is finished is calculated by multiplying the cutoff voltage of the battery module by the number of the battery modules.

Next, the discharge capacity of each of the discharged batteries 10a is measured (S103). The discharge capacity can be measured on the basis of the time period for which each of the batteries 10a is discharged to the cutoff voltage and the discharge current value. The calculation of the discharge capacity is performed in the discharge capacity calculating section 2 (see FIG. 1). The discharge capacity calculating section 2 is implemented, for example by computation processing with an ASIC (Application Specific Integrated Circuit), or processing performed by a processor such as a CPU or an MPU executing a program stored in a memory.

The processing at step S103 allows the discharge capacity in each of the plurality of batteries 10a to be obtained. When the discharge capacity varies among the plurality of batteries 10a, the maximum value and the minimum value of the discharge capacities can be determined. In this case, the difference (capacity difference) ΔAh is calculated between the discharge capacity (maximum value) and the discharge capacity (minimum value) (S104).

Next, it is determined whether or not the capacity difference ΔAh is equal to or larger than a predetermined value ΔAh_th (S105). The predetermined value ΔAh_th can be preset in view of the remaining life of the battery 10a. The capacity difference ΔAh becomes larger as the remaining life of a particular one of the batteries 10a becomes shorter than the remaining lives of the other batteries 10a in the assembled battery 10. Thus, the comparison between the capacity difference ΔAh and the predetermined value ΔAh_th can determine any battery 10a having a shorter remaining life.

When the capacity difference ΔAh is equal to or larger than the predetermined value ΔAh_th, it is determined that the assembled battery 10 (particularly, any battery 10a having a smaller discharge capacity Ah) has a remaining life equal to or shorter than a predetermined period (S106). The predetermined period can be set as appropriate from the viewpoint of reuse of the battery 10a. It can be determined that the battery 10a determined to have a remaining life longer than the predetermined period is reusable.

Specifically, when the capacity difference ΔAh described above exceeds a predetermined percentage (for example, 10%) of the full charge capacity of the assembled battery 10, it is determined that the remaining life of the assembled battery 10 (particularly, the battery 10a having a smaller discharge capacity Ah) is equal to or shorter than the predetermined period. The assembled battery 10 includes the plurality of batteries 10a formed as the unit, and when any battery 10a having a remaining life equal to or shorter than the predetermined period is included in the assembled battery 10, it is determined that the remaining life of the entire assembled battery 10 is equal to or shorter than the predetermined period. The battery 10a having the remaining life equal to or shorter than the predetermined period can be found by disassembling the plurality of batteries 10a constituting the assembled battery 10.

The predetermined percentage described above can be set as appropriate in view of the input/output characteristics of the assembled battery 10 or the like. The determination criterion of 10% is set, by way of example, since a discharge capacity variation of approximately 10% or smaller is an example of the criterion to determine that the battery 10a can be normally used (see, for example, Japanese Patent Laid-Open No. 2002-15781).

As described above, even when the discharge capacity variation (capacity difference ΔAh) exceeds 10%, all the batteries 10a constituting the assembled battery 10 do not necessarily have short remaining lives. In other words, only a particular one or ones of the batteries 10a may have a short remaining life. Thus, the average value of the discharge capacities of all the batteries 10a can be calculated, and any battery 10a having a discharge capacity lower than the average value (discharge capacity) by a predetermined value (for example, 10% of the full charge capacity) or more can be determined to have a short remaining life.

The battery 10a other than the battery 10a determined to have the short remaining life can be reused in manufacture of a new assembled battery 10. The method of selecting (extracting) the reusable battery 10a from the used assembled battery 10 is not limited to the method of comparing the discharge capacity of each of the batteries 10a with the average value of the discharge capacities, and the discharge capacity of each of the batteries 10a may be compared with another reference.

At step S101, it is desirable that each of the batteries 10a in the assembled battery 10 should be discharged until the SOC of the assembled battery 10 is reduced to 40% or lower. This is because the SOC of 40% may be set as the lower limit SOC_min of the normal use range, and when the SOC of the assembled battery 10 falls below the lower limit SOC_min of the normal range, a noticeable discharge capacity variation capacity difference ΔAh) starts to appear.

At step S101, more preferably, each of the batteries 10a in the assembled battery 10 is discharged until the SOC of the assembled battery 10 reaches 0%. This allows the observation of the discharge capacity variation (ΔAh) among the plurality of batteries 10a at its largest level, so that the remaining life determination can be performed more accurately. In other words, as the SOC of the assembled battery 10 is reduced, the capacity difference ΔAh can be increased to facilitate the recognition of the capacity difference ΔAh for use in the remaining life determination.

It is desirable that the discharge of each of the batteries 10a in the assembled battery 10 at step S101 should be started from the SOC of the assembled battery 10 set at the "SOC center". The SOC center refers to the reference value (SOC) serving as a target in charge and discharge of the assembled battery 10. The charge and discharge of the assembled battery 10 are controlled such that the SOC of the assembled battery 10 changes based on the SOC center.

Specifically, when the SOC of the assembled battery 10 is reduced below the SOC center, the assembled battery 10 is charged within the range in which the power required by a driver can be output. This is referred to as a charge/discharge driving mode. When the SOC of the assembled battery 10 is increased above the SOC center, the charge/discharge driving mode is reset to perform discharge of the assembled battery 10 preferentially.

The charge/discharge control of the assembled battery 10 with the SOC center used as the reference is often performed in the vehicle (particularly, a hybrid vehicle) on which the assembled battery 10 is mounted. The hybrid vehicle refers to a vehicle which includes not only the assembled battery 10 but also an engine or a fuel cell as the power source for running of the vehicle. In this manner, the SOC center characteristic of the vehicle on which the assembled battery 10 is mounted can be used as the reference in performing the discharge processing shown in FIG. 2 to recognize the discharge capacity variation (capacity difference ΔAh) among the plurality of batteries 10a quickly and efficiently as compared with the discharge processing started in the full charge state (the state in which the SOC is higher than the SOC center).

The discharge shown at step S101 can be performed in the assembled battery 10 removed from the vehicle, and preferably, the assembled battery 10 is not subjected to forced charge/discharge processing (particularly, charge processing) after the removal from the vehicle. This is because the discharge started in the forcedly charged state mitigates displacement of balance of capacity (variations in capacity due to the unevenness of quality during manufacture or the temperature of the environment to which the battery is exposed during the mounting on the vehicle) resulting from the actual use (charge and discharge) on the vehicle to hinder the observation of the capacity difference ΔAh.

Figure 3:
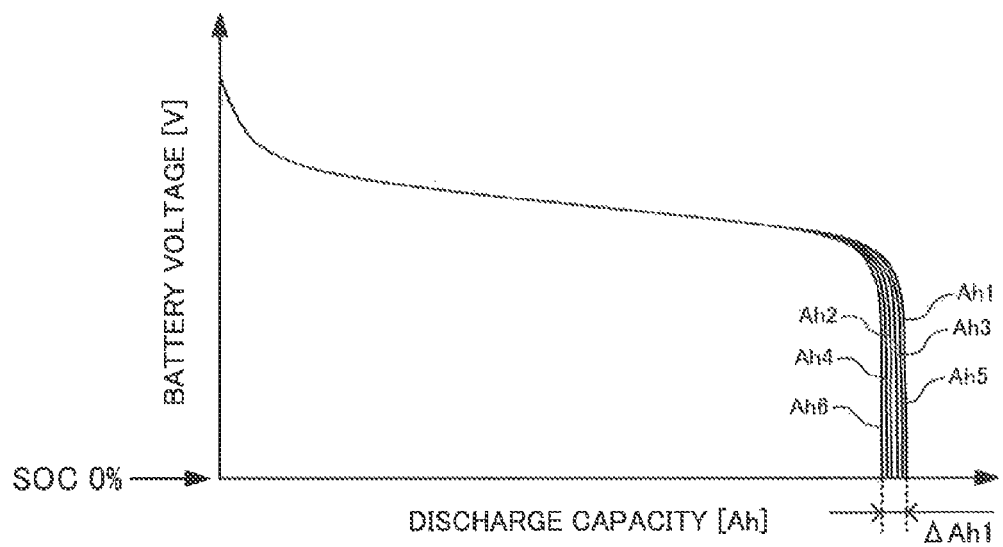
FIG. 3 is a graph showing the extent of a variation ΔAh of discharge capacities of a plurality of batteries when the assembled battery having a sufficient remaining life is discharged to an SOC of 0%.
Figure 4:
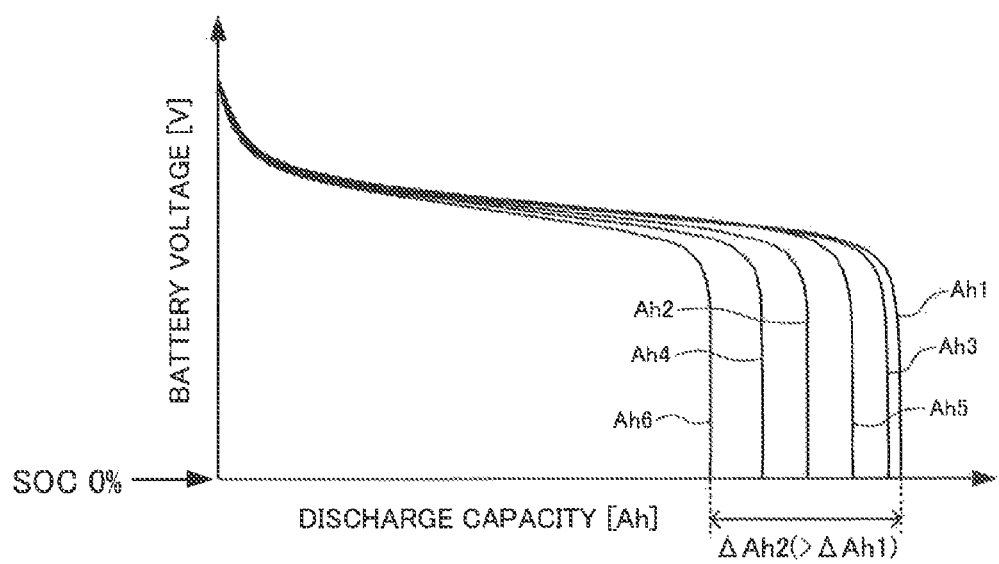
FIG. 4 is a graph showing the extent of a variation ΔAh of discharge capacities of a plurality of batteries when the assembled battery having a reduced charge amount in a negative electrode to have a shorter remaining life is discharged to an SOC of 0%.

FIG. 3 is a graph showing the extent of a variation ΔAh of the discharge capacities of the plurality of batteries 10a when the assembled battery 10 having a sufficient remaining life is discharged to an SOC of 0%. FIG. 4 is a graph showing the extent of a variation ΔAh of the discharge capacities of the plurality of batteries 10a when the assembled battery 10 including the battery 10a having a reduced charge amount in a negative electrode to have a shorter remaining life is discharged to an SOC of 0%. In FIG. 3 and FIG. 4, discharge curves (discharge capacities Ah1 to Ah6) are obtained for the six batteries 10a.

As shown in FIG. 3, for the assembled battery 10 having sufficient charge amounts in the negative electrodes to have the long remaining life, the variation (maximum capacity difference) of the discharge capacities Ah1 to Ah6 of the plurality of batteries 10a is ΔAh1 when the discharge is performed to an SOC of 0%. On the other hand, as shown in FIG. 4, for the assembled battery 10 including the battery 10a having the reduced charge amount in the negative electrode to have the shorter remaining life, the variation (maximum capacity difference) of the discharge capacities Ah1 to Ah6 of the plurality of batteries 10a when the discharge is performed to an SOC 0% is ΔAh2 which is significantly larger than the capacity difference ΔAh1 shown in FIG. 3.

Figure 5:
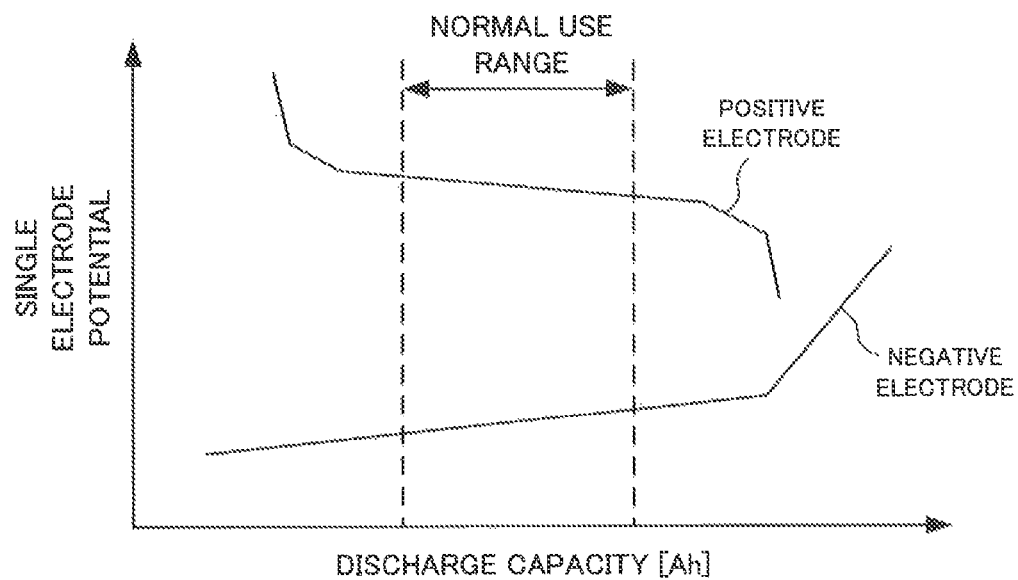
FIG. 5 is a graph showing the relationship between a discharge capacity and a single electrode potential (positive electrode potential and negative electrode potential) in a battery in which a capacity balance between a positive electrode and a negative electrode is not displaced.
Figure 6:
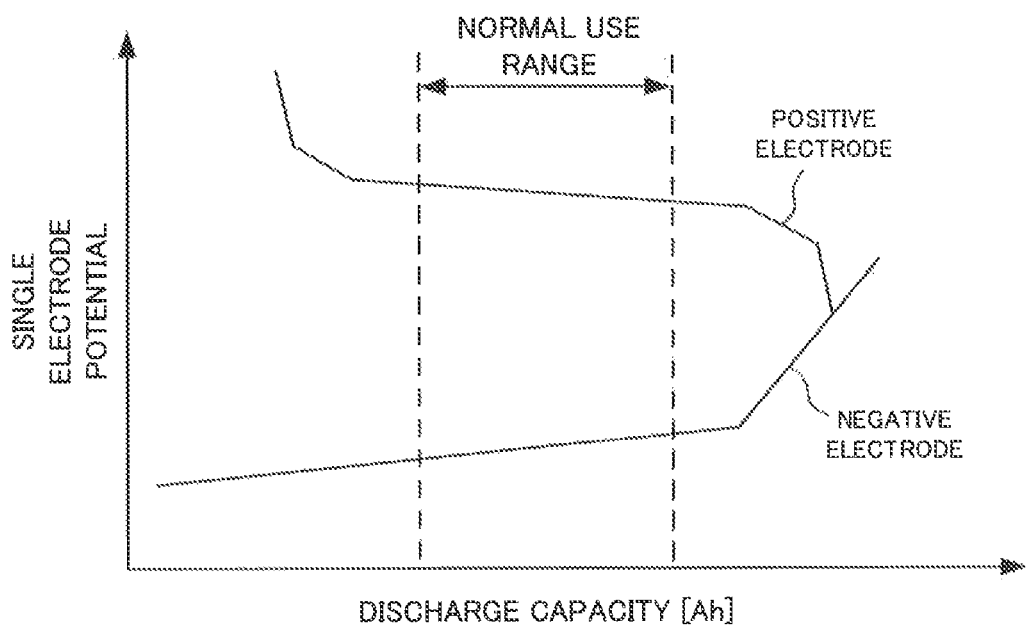
FIG. 6 is a graph showing the relationship between the discharge capacity and the single electrode potential (positive electrode potential and negative electrode potential) in the battery in which the capacity balance between the positive electrode and the negative electrode is displaced.

FIG. 5 and FIG. 6 are graphs each illustrating the relationship between the discharge capacity and a single electrode potential (positive electrode potential and negative electrode potential). In FIG. 5 and FIG. 6, the vertical axis represents the single electrode potential and the horizontal axis represents the discharge capacity.

The positive electrode potential and the negative electrode potential can be obtained by placing a reference electrode between the positive electrode and the negative electrode. The positive electrode potential is the potential between the positive electrode and the reference electrode, and the negative electrode potential is the potential between the negative electrode and the reference electrode. FIG. 5 shows the state in which the capacity balance between the positive electrode and the negative electrode is not displaced. FIG. 6 shows the state in which the capacity balance between the positive electrode and the negative electrode is displaced.

A conventional remaining life determination method includes predicting the deterioration of the battery based on changes in the voltage value (V) and the resistance value (R). However, when the deterioration of the battery 10a has not progressed to an advanced stage yet, for example when a charge amount in a negative electrode is reduced in the nickel metal hydride battery, noticeable changes in the voltage value (V) or the resistance value (R) cannot be observed until the point immediately before the remaining life expires. Specifically, when the charge amount in the negative electrode is reduced, the capacity balance between the positive electrode and the negative electrode is displaced to cause only the switching from the state shown in FIG. 5 to the state shown in FIG. 6, so that noticeable changes in the voltage value (V) or the resistance value (R) cannot be observed. Thus, the accurate estimation of the remaining life is prevented.

On the other hand, in the present embodiment, the assembled battery 10 is discharged until the SOC of the assembled battery 10 falls below the lower limit SOC_min of the normal use range, and the discharge capacity variation occurring at that time is observed, thereby allowing the recognition of the reduced charge amount in the negative electrode in each of the batteries 10a constituting the assembled battery 10. This enables the estimation of the remaining life of the assembled battery 10 (battery 10a).

The remaining life determination method described in the present embodiment can be used to determine the remaining life of the battery 10a in the assembled battery 10 recovered from the vehicle after running. The result of the determination of the remaining life is used to pick up only the battery 10a (the battery 10a as a so-called conforming item) having a discharge capacity within a relatively small variation. Such batteries 10a as the conforming items can be combined and packaged again into the assembled battery 10. This allows the effective reuse of the battery 10a having the sufficient remaining life.

The measurement of the discharge capacity may be performed for each battery module (corresponding to the battery 10a) including plurality of (for example, six) cells connected electrically in series, or may be performed for each block provided by grouping cells into blocks of n cells (n is a natural number larger than 1). In this case, the remaining life can be determined for each block.

DESCRIPTION OF THE REFERENCE NUMERALS

10: Assembled Battery, 10a Battery, PL: Positive Electrode Line, NL: Negative Electrode Line, 2: Discharge Capacity Calculating Section, 4: Electric Resistor, 3: Voltage Sensor, 5: Current Sensor, AH1 TO AH6: Discharge Capacity of Each Battery

The invention claimed is:

1. A remaining lifetime determination method comprising:
    discharging an assembled battery formed of a plurality of batteries until a state of charge (SOC) of the assembled battery becomes smaller or equal to a lower limit of a predetermined normal use range used in charge and discharge control of the assembled battery;
    measuring a discharge capacity of each of a plurality of battery blocks in the discharge of the assembled battery, the plurality of batteries being divided into the plurality of battery blocks;
    calculating a capacity difference in the discharge capacity among the plurality of battery blocks; and
    determining a remaining lifetime of the battery block or the assembled battery based on the calculated capacity difference.

2. The remaining lifetime determination method according to claim 1, wherein, when a capacity difference between a maximum value and a minimum value of the discharge capacities of the plurality of battery blocks is equal to or larger than a predetermined value, it is determined that the remaining lifetime of the assembled battery or the remaining lifetime of any battery block having a smaller discharge capacity is equal to or shorter than a predetermined period.

3. The remaining lifetime determination method according to claim 1, wherein the lower limit is the state of charge (SOC) of 40%.

4. The remaining lifetime determination method according to claim 1, wherein the lower limit is the state of charge (SOC) of 0%.

5. The remaining lifetime determination method according to claim 1, wherein the assembled battery is discharged until the state of charge (SOC) of the assembled battery becomes smaller or equal to the lower limit from a reference value serving as a target in the charge and discharge control.

6. The remaining lifetime determination method according to claim 5, wherein the lower limit is the state of charge (SOC) of 40% or 0%.

7. The remaining lifetime determination method according to claim 1, wherein the assembled battery not subjected to charge or discharge processing after removal from a vehicle is used to perform the discharge until the state of charge (SOC) becomes smaller or equal to the lower limit.

8. The remaining lifetime determination method according to claim 7, wherein the lower limit is the state of charge (SOC) of 40% or 0%.

* * * * *